United States Patent
Nakayama et al.

(10) Patent No.: US 7,563,514 B2
(45) Date of Patent: Jul. 21, 2009

(54) TRANSPARENT CONDUCTIVE FILM AND TRANSPARENT CONDUCTIVE BASE MATERIAL UTILIZING THE SAME

(75) Inventors: Tokuyuki Nakayama, Ichikawa (JP); Yoshiyuki Abe, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 29 days.

(21) Appl. No.: 10/575,471

(22) PCT Filed: Dec. 28, 2004

(86) PCT No.: PCT/JP2004/019595

§ 371 (c)(1), (2), (4) Date: Apr. 12, 2006

(87) PCT Pub. No.: WO2005/083722

PCT Pub. Date: Sep. 9, 2005

(65) Prior Publication Data

US 2007/0051926 A1 Mar. 8, 2007

(30) Foreign Application Priority Data

Feb. 27, 2004 (JP) ............................. 2004-054816
Dec. 15, 2004 (JP) ............................. 2004-363269

(51) Int. Cl.
*B32B 9/00* (2006.01)

(52) U.S. Cl. ..................... 428/432; 428/426; 428/698; 428/701; 428/702

(58) Field of Classification Search ....................... None
See application file for complete search history.

(56) References Cited

U.S. PATENT DOCUMENTS 6,379,824 B1 4/2002 Hosokawa
6,391,462 B1 * 5/2002 Jang ........................... 428/432
2003/0218153 A1 * 11/2003 Abe ............................ 252/500

FOREIGN PATENT DOCUMENTS

| EP | 0 993 236 A1 | 4/1999 |
| EP | 0 651 399 | 5/1999 |
| EP | 1 359 626 | 11/2003 |
| JP | 409259640 A * | 10/1997 |

(Continued)

OTHER PUBLICATIONS

"Work function of transparent conducting multicomponent oxide thin films prepared by magnetron sputtering," Tadatsugu Minami, et al., Surface and Coatings Technology, vols. 108-109, Nos. 1-3, pp. 583-587, Oct. 10, 1998.

*Primary Examiner*—Timothy M Speer
(74) *Attorney, Agent, or Firm*—Smith, Gambrell & Russell, LLP

(57) ABSTRACT

The transparent conductive film 1 includes laminated transparent conductive thin films 10 and 20 of at least two layers. The transparent conductive thin film of the uppermost layer is an amorphous oxide thin film composed of gallium, indium, and oxygen, a gallium content ranges from 49.1 atom % to 65 atom % with respect to all metallic atoms, a work function is 5.1 eV or more, and a surface resistance is 100 Ω/□ or less. The transparent conductive base material includes a transparent substrate and the transparent conductive film 1 formed one or both surfaces of the transparent substrate.

10 Claims, 1 Drawing Sheet

FOREIGN PATENT DOCUMENTS

| | | |
|---|---|---|
| JP | 11-297478 A | 10/1999 |
| JP | 2000-48966 A | 1/2000 |
| JP | 2000 223276 | 8/2000 |
| JP | 2003 100154 | 4/2003 |
| WO | WO 99/53727 A1 | 10/1999 |
| WO | 03/059532 | 7/2003 |

* cited by examiner

TRANSPARENT CONDUCTIVE FILM AND TRANSPARENT CONDUCTIVE BASE MATERIAL UTILIZING THE SAME

TECHNICAL FIELD

This invention relates to a transparent conductive film used in an organic electroluminescence (EL) element or the like and a transparent conductive base material utilizing this transparent conductive film.

BACKGROUND ART

The transparent conductive films have a high conductivity (for example, a resistivity of $1 \times 10^{-3}$ Ωcm or less) and a high transmittance in the visible region and thus are utilized as the electrodes of solar cells, liquid crystal display elements and other various light-receiving elements, followed by heat wave reflective films used for window glass of cars and buildings, various antistatic films, and antifogging transparent heating elements for refrigerating show cases.

As the transparent conductive films, antimony- or fluorine-doped tin oxide ($SnO_2$) films, aluminum- or gallium-doped zinc oxide (ZnO) films, and tin-doped indium oxide ($In_2O_3$) films are widely utilized. In particular, the tin-doped indium oxide films, namely $In_2O_3$—Sn based films, are referred to as ITO (indium tin oxide) films and are widely used in various devices, not to speak of LCDs, because low-resistance transparent conductive films are easily obtained.

The ITO film is also used as the electrode of the organic EL element. Since the organic EL element is such that driving voltage is considerably lowered and thereby its compact design is facilitated, researches concerning the practical use of the organic EL element as a display element of the next generation are actively conducted. The organic EL element is designed so that the lamination of an anode/a light-emitting layer/a cathode is fundamentally used and generally, the ITO film is formed as a transparent anode on a substrate using a glass plate or the like. Positive holes are injected from the anode and thus it is desirable that the work function of the anode is rather high. In this case, a work function of at least 4.4 eV is required, but it is desirable to be 5.0 eV or more. However, it is generally known that the work function of the ITO film is about 4.4 eV, and this work function is not sufficient to use the ITO film as the anode of the organic EL element.

Generally, as set forth in Non-Patent References 1 described below, it is necessary to give the surface of the ITO film acid cleaning and UV ozone cleaning and to increase the work function to approximately 5.0 eV. However, the work function is highly sensitive to a processing condition and thus its control is difficult. It is also reported that the work function is sometimes returned to a value before processing by leaving the ITO film for a certain time.

Patent Reference 1 described below proposes the organic electroluminescence element in which an organic layer containing an organic light-emitting layer is sandwiched between the anode and the cathode so that the cathode comprises, in order from a side coming in contact with the organic layer, an electron injection electrode layer, a transparent conductive film, and a metallic thin film with a resistivity of $1 \times 10^{-5}$ Ωcm or less, laminated one over another and a transparent thin film layer is formed outside the cathode. As this transparent thin film layer, an amorphous transparent conductive film using an oxide composed of indium (In), zinc (Zn), and oxygen (O), namely a so-called IZO film, is used.

The IZO film is a stable amorphous film in which not only is the resistivity low, but also microcrystals are not contained, and hence is useful for the electrode film of the organic EL element. However, the work function of the IZO film is about 4.8-4.9 eV, which is not said to be high enough to use the IZO film as the anode of the organic EL element. It becomes necessary to improve the work function by surface treatment as in the ITO film.

As mentioned above, the transparent conductive film which is useful for the anode of the organic EL element, high in work function, and high in conductivity has not yet been produced and its development is expected.

Patent Reference 1: Japanese Patent Kokai No. Hei 7-182924

Non-Patent Reference 1: "New development of transparent conductive film II", CMC Press, First edition, p. 203.

DISCLOSURE OF THE INVENTION

The object of the present invention is to provide a transparent conductive film which combines a low surface resistance with a high work function and is laminated by transparent conductive thin films, and a transparent conductive base material using this transparent conductive film.

The transparent conductive film which is an amorphous oxide film composed of Ga, In, and O and which has a Ga content ranging from 49.1 atom % to 65 atom % with respect to all metallic atoms does not yet have sufficiently satisfactory conductivity to be used as the transparent electrode of the organic EL element. However, it has the feature that the work function is as high as 5.1 eV or more, and by employing the feature of this high work function, transparent conductive thin films of at least two layers are laminated in turn on the substrate to form laminated films. A first transparent conductive thin film of the uppermost layer is an amorphous oxide thin film composed of gallium, indium, and oxygen, and the transparent conductive film which has a gallium content ranging from 49.1 atom % to 65 atom % with respect to all metallic atoms is used. Whereby, a transparent conductive film in which the work function is 5.1 eV or more and the surface resistance of the laminated films is 100 Ω/□ or less can be obtained. The present inventors find this fact to perfect the present invention.

Specifically, the transparent conductive film of the present invention comprises transparent conductive thin films of at least two layers laminated on the substrate. In this case, the first transparent conductive thin film of the uppermost layer is the amorphous oxide thin film composed of gallium, indium, and oxygen, a gallium content ranges from 49.1 atom % to 65 atom % with respect to all metallic atoms, the work function is 5.1 eV or more, and the surface resistance is 100 Ω/□ or less.

According to the present invention, the surface resistance should preferably be 50 Ω/□ or less.

According to the present invention, another transparent conductive thin film formed on the substrate side of the first transparent conductive thin film includes any one or more of an amorphous oxide thin film composed of indium, tin, and oxygen; of indium, zinc, and oxygen; of indium, tungsten, and oxygen; and of indium, tungsten, zinc, and oxygen.

According to the present invention, the thickness of the first transparent conductive thin film is 5 nm or more and the total film thickness of laminated transparent conductive thin films is 300 nm or less.

According to the present invention, an arithmetic mean height (Ra) of the surface of the first transparent conductive thin film is 2.0 nm or less.

The transparent conductive base material according to the present invention includes a transparent substrate selected from among a glass plate, a quartz plate, a resin plate or a resin film whose one or both surfaces are coated with gas barrier films, and a resin plate or a resin film into which the gas barrier film is inserted, and the transparent conductive film formed on one or both surfaces of the transparent substrate.

According to the present invention, the gas barrier film is at least one selected from among a silicon oxide film, a silicon oxide-nitride film, a magnesium aluminate film, a tin oxide-based film, and a diamond-like carbon film.

According to the present invention, the resin plate or the resin film is formed of polyethylene terephthalate (PET), polyether sulfone (PES), polyarylate (PAR), or polycarbonate (PC), or has a lamination structure in which its surface is coated with acrylic-based organic matter.

The transparent conductive film of the present invention comprises laminated films in which transparent conductive thin films of at least two layers are laminated in turn on the substrate. The transparent conductive thin film of the uppermost layer is the amorphous oxide thin film composed of gallium, indium, and oxygen and the transparent conductive film which has a gallium content ranging from 49.1 atom % to 65 atom % with respect to all metallic atoms is used. Whereby, it becomes possible to obtain the transparent conductive film in which the work function is 5.1 eV or more and the surface resistance is 100 Ω/□ or less that formerly has never been attained.

In particular, when the transparent conductive film is used as the anode of the organic EL element or the like, the injection of positive holes become easy. As a result, the transparent conductive film is capable of improving the light-emitting efficiency of the organic EL element and this is useful.

The transparent conductive base material of the present invention is obtained by forming the transparent conductive film of the present invention after the gas barrier film is formed, when the necessity arises, not only on a glass substrate or a quartz substrate but also on a resin substrate that has no heat resistance or a flexible resin film substrate. Hence, in any shape and contour of the device, the transparent conductive base material can be utilized as the base material of a flexible transparent organic EL element using the resin film substrate. This is extremely high in the value of industry.

BEST MODE FOR CARRYING OUT THE INVENTION

Figure 1:
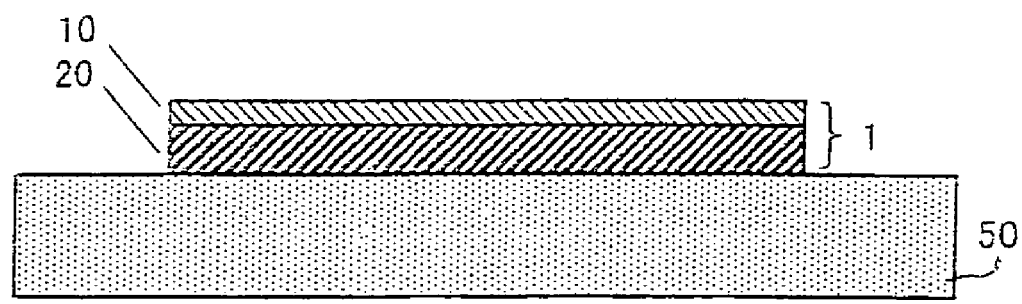
FIG. 1 is a sectional view showing a fundamental structure of the transparent conductive base material in which the transparent conductive film is formed on a substrate.

The transparent conductive film according to the present invention comprises laminated films in which transparent conductive thin films of at least two layers are laminated in turn on the substrate. The transparent conductive thin film of the uppermost layer is the amorphous oxide thin film composed of gallium, indium, and oxygen, a gallium content ranges from 49.1 atom % to 65 atom % with respect to all metallic atoms, the work function is 5.1 eV or more, and the surface resistance of the laminated films is 100 Ω/□ or less. When the gallium content is below 49.1 atom %, the work function is reduced, and beyond 65 atom %, a sufficient conductivity for the conductive film is not obtained.

It is desirable that another transparent conductive thin film laminated on the substrate side of the transparent conductive thin film of the uppermost layer includes any one or more of an amorphous oxide thin film composed of indium, tin, and oxygen; of indium, zinc, and oxygen; of indium, tungsten, and oxygen; and of indium, tungsten, zinc, and oxygen.

The four types of transparent conductive thin films mentioned above are deposited at room temperatures and thereby an amorphous thin film exhibiting a low resistivity of the order of $1 \times 10^{-4}$ Ωcm can easily be obtained. In particular, the amorphous oxide thin film composed of indium, zinc, and oxygen, the amorphous oxide thin film composed of indium, tungsten, and oxygen, and the amorphous oxide thin film composed of indium, tungsten, zinc, and oxygen are nearly perfect amorphous films such that microcrystals are not virtually contained. Each of these films, therefore, is further favorable for the electrode of the organic EL element which rejects the surface roughness of the film caused by the existence of the microcrystals.

In the laminated films, it is desirable that the transparent conductive thin film of the uppermost layer has a thickness range from 5 nm to 50 nm and the total thickness of the laminated films is 300 nm or less. If the thickness of the transparent conductive thin film of the uppermost layer is below 5 nm, a stable, high work function cannot be obtained. On the other hand, beyond 50 nm, when a first layer (the uppermost layer) is laminated on the transparent conductive thin film of each of a second layer and succeeding layers, the proportion of the film thickness of the uppermost layer to the total thickness of the laminated films is increased to cause a high resistance. If the total thickness of the laminated films is beyond 300 nm and the first layer (the uppermost layer) is laminated on the transparent conductive thin film of each of the second layer or succeeding layers, the transparent conductive thin film of each of the second layer and succeeding layers becomes so thick that coloration occurs and a sufficient transmittance cannot be obtained. Below 100 nm, the surface resistance of the laminated films is increased and thus it is desirable that the total thickness of the laminated films is 100 nm or more.

It is desirable that the arithmetic mean height (Ra) of the surface of the transparent conductive thin film of the first layer is 2.0 nm or less. It is further desirable that the height is 1.0 nm or less. If the arithmetic mean height (Ra) of the surface of the transparent conductive thin film of the first layer is beyond 2.0 nm, for example, when this film is used as the electrode of the organic EL element, a leak is caused at the convexity of the electrode, and hence the problem arises that many dark spots are produced on the organic EL element. This is unfavorable.

The transparent conductive base material of the present invention is provided in such a way that the transparent conductive film of the present invention is formed on the surface of the transparent substrate.

As the transparent substrate, a glass plate, a quartz plate, a resin plate or a resin film whose one or both surfaces are coated with gas barrier films, or a resin plate or a resin film into which the gas barrier film is inserted is used.

The resin plate or the resin film is higher in gas transmittance than the glass plate, and the light-emitting layer of the organic EL element or the inorganic EL element and the liquid crystal layer of an LCD are deteriorated by moisture and oxygen. It is thus desirable that when the resin plate or the resin film is used as the substrate of such a display element, the gas barrier film that blocks the passage of a gas is applied.

The gas barrier film may be formed on one surface of the resin plate or the resin film, and when it is formed on both surfaces, the blockage of the gas passage becomes more favorable. The gas barrier film is formed on one surface of the resin plate or the resin film, and another resin plate or resin film is laminated on this gas barrier film. Whereby, a structure that the gas barrier film is inserted between resin plates or resin films can be obtained. Moreover, lamination can be repeated a plurality of times.

The resin plate or the resin film is formed of polyethylene terephthalate (PET), polyether sulfone (PES), polyarylate (PAR), polycarbonate (PC), or has a lamination structure in which the surface of this material is coated with acrylic-based organic matter. The thickness of the resin plate or the resin film is properly selected in accordance with specific applications to be described below.

It is desirable that the gas barrier film is at least one selected from among particular films: a silicon oxide film, a silicon oxide-nitride (SiON) film, a magnesium aluminate film, a tin oxide-based film, and a diamond-like carbon (DLC) film. Here, the tin oxide-based film has a composition containing an element of at least one kind selected from among Si, Ce, and Ge, added to tin oxide. A tin oxide layer is amorphized by such an additive element so that a dense film is formed. The transparent conductive film may be formed on the substrate of a structure that at least one gas barrier film selected from among the particular films: the silicon oxide film, the silicon oxide-nitride film, the magnesium aluminate film, the tin oxide-based film, and the diamond-like carbon film and an organic or polymer film are alternately repeatedly laminated on the surface of the resin substrate or the resin film.

Embodiments

In accordance with FIGS. 1 and 2, the structures of embodiments will be described.

FIG. 1 is a sectional view showing the fundamental structure of the transparent conductive base material used in Embodiments 1-6. A transparent conductive film 1 is fabricated which has the lamination structure including a transparent conductive thin film 20 and a transparent conductive thin film 10 composed of gallium, indium, and oxygen, laminated in turn on a glass substrate (7059 substrate by Corning Inc.) 50. The transparent conductive thin films 10 and 20 are deposited through a direct-current magnetron sputtering method by using an SPF-530H sputtering device made by ANELVA Corporation. The transparent conductive thin films 10 and 20 are also deposited by adjusting the time so that preset film thicknesses are reached, using a gas mixture of argon and oxygen, at an output of 200 W under the conditions of a gas pressure of 0.5 Pa and a proportion of an oxygen flow rate of 1.5-2.5%.

Figure 2:
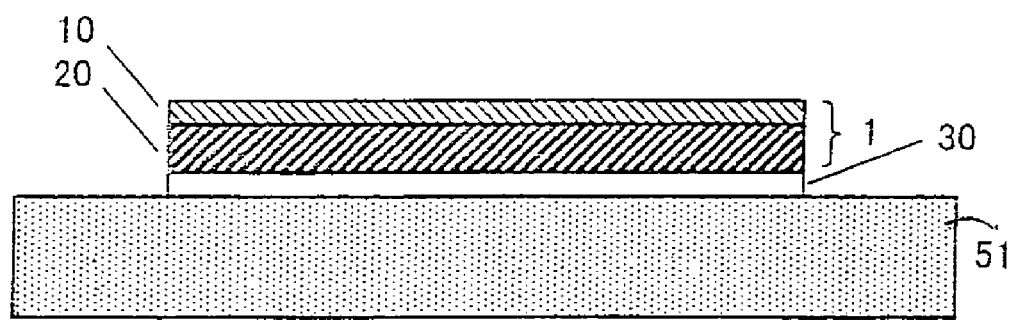
FIG. 2 is a sectional view showing a fundamental structure of the transparent conductive base material in which the gas barrier film is formed on the substrate and the transparent conductive film is formed on the gas barrier film.

FIG. 2 is a sectional view showing the fundamental structure of the transparent conductive base material used in Embodiment 7. A silicon oxide-nitride film with a thickness of 100 nm is previously formed as a gas barrier film 30 on a substrate 51 formed of a PES film with a thickness of 200 μm, and the transparent conductive film 1 that is the same as in Embodiments 1-6 is formed on the gas barrier film 30.

The work function of the transparent conductive film 1 thus obtained is measured in the atmosphere by a photoelectron spectrometer (AC-2 by Riken Keiki Co., Ltd.). The surface resistance of the film is measured by the 4-pin probe technology of a resistivity meter, Loresta-EP (MCP-T360 by Dia Instruments Co., Ltd.). The surface roughness of the film is measured by an atomic force microscope (NS-III, D5000 System by Digital Instruments Co., Ltd.). The light transmittance of the film containing the substrate 51 is measured by a spectrophotometer (U-4000 by Hitachi, Ltd.).

In Embodiments 1-3, the transparent conductive thin film 20 is formed as an $In_2O_3$-1 wt % $WO_3$ amorphous film with a thickness of 150 nm, and the transparent conductive thin film 10 is formed as an amorphous film with a thickness of 10 nm, composed of gallium, indium, and oxygen, to change the gallium content. In Embodiments 4-6, the transparent conductive thin film 10 is formed as an amorphous film with a thickness of 10 nm, composed of gallium whose content is 50 atom %, indium, and oxygen, and the transparent conductive thin film 20 is formed as one selected from among an $In_2O_3$-10 wt % $SnO_2$ amorphous film, an $In_2O_3$-10 wt % ZnO amorphous film, and an $In_2O_3$-1 wt % $WO_3$-0.5 wt % ZnO amorphous film, each with a thickness of 150 nm, and is combined with the transparent conductive thin film 10.

In Embodiments 7 and 8, the transparent conductive thin film 10 is formed to have a thickness of 5 nm and a gallium content of 50 atom %, while the transparent conductive thin film 20 is formed as an $In_2O_3$-1 wt % $WO_3$ amorphous film with a thickness of 150 nm, and the gas barrier film 30 is sandwiched between the transparent conductive film 1 and the substrate. Various values of the work functions and the surface resistances in Embodiments 1-9 are shown in Table 1.

TABLE 1

| | Thin film 10 | | Thin film 20 | | Film evaluation | | | |
|---|---|---|---|---|---|---|---|---|
| | Thickness nm | Gallium content atom % | Thickness nm | Film composition | Work function eV | Surface resistance Ω/□ | Arithmetic mean height Ra nm | Visible region mean transmittance % |
| Embodiment 1 | 10 | 49.1 | 150 | $In_2O_3$—1 wt % $WO_3$ | 5.19 | 24.3 | 0.74 | 83.8 |
| Embodiment 2 | 10 | 50 | 150 | $In_2O_3$—1 wt % $WO_3$ | 5.34 | 24.5 | 0.76 | 83.6 |
| Embodiment 3 | 10 | 65 | 150 | $In_2O_3$—1 wt % $WO_3$ | 5.33 | 24.9 | 0.76 | 83.5 |
| Embodiment 4 | 10 | 50 | 150 | $In_2O_3$—10 wt % $SnO_2$ | 5.29 | 32.5 | 1.58 | 84.1 |
| Embodiment 5 | 10 | 50 | 150 | $In_2O_3$—10 wt % ZnO | 5.30 | 24.6 | 0.71 | 83.2 |
| Embodiment 6 | 10 | 50 | 150 | $In_2O_3$—1 wt % $WO_3$—0.5 wt % ZnO | 5.35 | 24.4 | 0.81 | 83.5 |
| Embodiment 7 | 5 | 50 | 150 | $In_2O_3$—1 wt % $WO_3$ | 5.12 | 24.5 | 0.74 | 83.1 |
| Embodiment 8 | 10 | 50 | 290 | $In_2O_3$—1 wt % $WO_3$ | 5.20 | 12.7 | 1.18 | 80.5 |
| Embodiment 9 | 10 | 50 | 150 | $In_2O_3$—1 wt % $WO_3$ | 5.20 | 25.6 | 0.79 | 81.2 |

Embodiments 1-3

The transparent conductive thin film 10 is formed as an amorphous film with a thickness of 10 nm, composed of gallium, indium, and oxygen, and three kinds of compositions are provided so that gallium contents are 49.1, 50, and 65 atom %, respectively, with respect to all metallic atoms. The transparent conductive thin film 20 is formed as an $In_2O_3$-1 wt % $WO_3$ amorphous film with a thickness of 150 nm.

As seen from Embodiments 1-3, when the gallium content of the transparent conductive thin film 10 is in the range of 49.1 to 65 atom %, the transparent conductive film 1 with a work function of 5.1 eV or more and a surface resistance of 50 $\Omega/\square$ or less can be attained.

Embodiments 4-6

The transparent conductive thin film 10 is formed as an amorphous film with a thickness of 10 nm, composed of gallium, indium, and oxygen, and only one kind of composition is provided so that the gallium content is 50 atom % with respect to all metallic atoms. The transparent conductive thin film 20 is formed as one selected from among an $In_2O_3$-10 wt % $SnO_2$ amorphous film, an $In_2O_3$-10 wt % ZnO amorphous film, and an $In_2O_3$-1 wt % $WO_3$-0.5 wt % ZnO amorphous film, each with a thickness of 150 nm.

As seen from Embodiments 4-6, when the transparent conductive thin film 10 with a thickness of 10 nm and a gallium content of 50 atom % is combined with the transparent conductive thin film 20 formed as one selected from among the $In_2O_3$-10 wt % $SnO_2$ amorphous film, the $In_2O_3$-10 wt % ZnO amorphous film, and the $In_2O_3$-1 wt % $WO_3$-0.5 wt % ZnO amorphous film, each with a thickness of 150 nm, the transparent conductive film 1 with a work function of 5.1 eV or more and a surface resistance of 50 $\Omega/\square$ or less can be attained.

Embodiment 7

The transparent conductive thin film 10 is formed as an amorphous film with a thickness of 5 nm, composed of gallium, indium, and oxygen, and only one kind of composition is provided so that the gallium content is 50 atom % with respect to all metallic atoms. The transparent conductive thin film 20 is formed as an $In_2O_3$-1 wt % $WO_3$ amorphous film with a thickness of 150 nm.

As seen from Embodiment 7, even when the transparent conductive thin film 10 is as thin as 5 nm, the transparent conductive film 1 with a work function of 5.1 eV or more and a surface resistance of 50 $\Omega/\square$ or less can be attained.

Embodiment 8

The transparent conductive thin film 10 is formed as an amorphous film with a thickness of 10 nm, composed of gallium, indium, and oxygen, and only one kind of composition is provided so that the gallium content is 50 atom % with respect to all metallic atoms. The transparent conductive thin film 20 is formed as an $In_2O_3$-1 wt % $WO_3$ amorphous film with a thickness of 290 nm.

As seen from Embodiment 8, even when the total film thickness is increased to 300 nm, the transparent conductive film 1 with a work function of 5.1 eV or more and a surface resistance of 50 $\Omega/\square$ or less is obtained. The mean transmittance in the visible region is beyond 80% and there is no problem of coloration even at a visual level.

Embodiment 9

A silicon oxide-nitride film with a thickness of 100 nm is previously formed as a gas barrier film on a PES film substrate with a thickness of 200 μm, and the transparent conductive film 1 of the same structure as in Embodiment 2 is formed on the gas barrier film.

From Embodiment 9, it is seen that even in the use of a resin film that the gas barrier film 30 is previously formed on the substrate, the transparent conductive film 1 with a work function of 5.1 eV or more and a surface resistance of 50 $\Omega/\square$ or less is obtained.

COMPARATIVE EXAMPLES 1-5

The transparent conductive base material of the same structure as in Embodiments 1-6 is fabricated.

In Comparative examples 1-3, the transparent conductive thin film 20 is formed as an $In_2O_3$-1 wt % $WO_3$ amorphous film with a thickness of 150 nm, and the gallium content of the transparent conductive thin film 10 with a thickness of 10 nm is changed. In Comparative examples 4-5, the transparent conductive thin film 10 is formed to have a thickness of 3 nm and a gallium content of 50 atom % and the transparent conductive thin film 20 is formed as an $In_2O_3$-1 wt % $WO_3$ amorphous film with a thickness of 150 nm, while the transparent conductive thin film 10 is formed to have a thickness of 10 nm and a gallium content of 50 atom % and the transparent conductive thin film 20 is formed as an $In_2O_3$-10 wt % $SnO_2$ amorphous film with a thickness of 300 nm. Various values of the work functions and the surface resistances in Comparative examples 1-5 are shown in Table 2.

TABLE 2

| | Thin film 10 | | Thin film 20 | | Film evaluation | | | |
|---|---|---|---|---|---|---|---|---|
| | Thickness nm | Gallium content atom % | Thickness nm | Film composition | Work function eV | Surface resistance $\Omega/\square$ | Arithmetic mean height Ra nm | Visible region mean transmittance % |
| Comparative example 1 | 10 | 30 | 150 | $In_2O_3$—1 wt % $WO_3$ | 4.88 | 24.4 | 0.75 | 83.9 |
| Comparative example 2 | 10 | 45 | 150 | $In_2O_3$—1 wt % $WO_3$ | 4.97 | 24.6 | 0.74 | 83.6 |
| Comparative example 3 | 10 | 70 | 150 | $In_2O_3$—1 wt % $WO_3$ | 5.32 | unavailable | 0.71 | 83.2 |
| Comparative example 4 | 3 | 50 | 150 | $In_2O_3$—1 wt % $WO_3$ | 4.96 | 24.5 | 0.77 | 83.1 |
| Comparative example 5 | 10 | 50 | 340 | $In_2O_3$—10 wt % $SnO_2$ | 5.32 | 10.8 | 3.55 | 76.1 |

In Comparative examples 1-3, the transparent conductive thin film 10 is formed as an amorphous film with a thickness of 10 nm, composed of gallium, indium, and oxygen, and three kinds of compositions are provided so that gallium contents are 30, 45, and 70 atom %, respectively, with respect to all metallic atoms. The transparent conductive thin film 20 is formed as an $In_2O_3$-1 wt % $WO_3$ amorphous film with a thickness of 150 nm.

As seen from Comparative examples 1 and 2, when the gallium content of the transparent conductive thin film 10 is reduced to 45 atom % and further to 30 atom %, the work function becomes less than 5.0 eV, which is unfavorable. As seen from Comparative example 3, when the gallium content of the transparent conductive thin film 10 is increased to 70 atom %, the conductivity is lost, which is unfavorable.

In Comparative example 4, the transparent conductive thin film 10 is formed as an amorphous film with a thickness of 5 nm, composed of gallium, indium, and oxygen, and only one kind of composition is provided so that the gallium content is 50 atom % with respect to all metallic atoms. The transparent conductive thin film 20 is formed as an $In_2O_3$-1 wt % $WO_3$ amorphous film with a thickness of 150 nm.

As seen from Comparative example 4, when the thickness of the transparent conductive film 10 is reduced to 3 nm, the work function becomes less than 5.0 eV, which is unfavorable.

In Comparative example 5, the transparent conductive thin film 10 is formed as an amorphous film with a thickness of 50 nm, composed of gallium, indium, and oxygen, and only one kind of composition is provided so that the gallium content is 50 atom % with respect to all metallic atoms. The transparent conductive thin film 20 is formed as an $In_2O_3$-10 wt % $SnO_2$ amorphous film with a thickness of 300 nm.

As seen from Comparative example 5, when the thickness of the transparent conductive thin film 10 is increased to 50 nm and the thickness of the transparent conductive thin film 20 is increased to 300 nm, namely the thickness of the lamination film to 350 nm, a work function of 5.1 eV or more and a good conductivity that is appreciably less than 50 Ω/□ can be obtained. However, film coloration is recognized at the visual level and transparency is impaired. As such, this is unfavorable for the transparent electrode used in the organic EL element or the like.

INDUSTRIAL APPLICABILITY

In particular, when the transparent conductive film of the present invention is used as the anode of the organic EL element or the like, the injection of positive holes become easy. As a result, the light-emitting efficiency of the organic EL element can be improved, which is useful.

The transparent conductive base material of the present invention is obtained by forming the transparent conductive film of the present invention after the gas barrier film is formed, when the necessity arises, not only on a glass substrate or a quartz substrate but also on a resin substrate that has no heat resistance or on a flexible resin film substrate. Hence, in any shape and contour of the device, the transparent conductive base material can be utilized as the base material of a flexible transparent organic EL element using the resin film substrate and this is extremely high in the value of industry.

The invention claimed is:

1. A transparent conductive film comprising laminated transparent conductive thin films of at least two layers, wherein a transparent conductive thin film of an uppermost layer is an amorphous oxide thin film composed of gallium, indium, and oxygen, with a gallium content ranging from 49.1 atom % to 65 atom % with respect to all metallic atoms, wherein a transparent conductive thin film other than the transparent conductive thin film of the uppermost layer includes at least one of an amorphous oxide thin film composed of: indium, tin, and oxygen; an amorphous oxide thin film composed of indium, zinc and oxygen; an amorphous oxide thin film composed of indium, tungsten, and oxygen; and an amorphous oxide thin film composed of indium, tungsten, zinc and oxygen, and wherein a work function is 5.1 eV or more, and a surface resistance is 100 Ω/□ or less.

2. A transparent conductive film comprising laminated transparent conductive thin films of at least two layers, wherein a transparent conductive thin film of an uppermost layer is an amorphous oxide thin film composed of gallium, indium, and oxygen, with a gallium content ranging from 49.1 atom % to 65 atom % with respect to all metallic atoms, wherein a transparent conductive thin film other than the transparent conductive thin film of the uppermost layer includes at least one of an amorphous oxide thin film composed of indium, tin, and oxygen; an amorphous oxide thin film composed of indium, zinc and oxygen; an amorphous oxide thin film composed of indium, tungsten, and oxygen; and an amorphous oxide thin film composed of indium, tungsten, zinc and oxygen, and wherein a work function is 5.1 eV or more, and a surface resistance is 50 Ω/□ or less.

3. A transparent conductive film according to claims 1 or 2, wherein a thickness of the transparent conductive thin film of the uppermost layer is 5 nm or more and a total film thickness of the transparent conductive film is 300 nm or less.

4. A transparent conductive film according to claim 3, wherein an arithmetic mean height of a surface of the transparent conductive thin film of the uppermost layer is 2.0 nm or less.

5. A transparent conductive film according to claims 1 or 2, wherein an arithmetic mean height of a surface of the transparent conductive thin film of the uppermost layer is 2.0 nm or less.

6. A transparent conductive base material comprising:
a transparent substrate; and
a transparent conductive film according to claims 1 or 2, formed on one or both surfaces of the transparent substrate, the transparent substrate being one of a glass plate, a quartz plate, a resin plate or a resin film whose one or both surfaces are coated with gas barrier films, and a resin plate or a resin film into which the gas barrier film is inserted.

7. A transparent conductive base material according to claim 6, wherein the gas barrier film is at least one selected from among a silicon oxide film, a silicon oxide-nitride film, a magnesium aluminate film, a tin oxide-based film, and a diamond-like carbon film.

8. A transparent conductive base material according to claim 6, wherein the resin plate or the resin film is formed of polyethylene terephthalate, polyether sulfone, polyarylate, or polycarbonate, or has a lamination structure in which a surface of the resin plate or the resin film is coated with acrylic-based organic matter.

9. A transport conductive film according to claim 1 or 2, wherein the gallium content ranges from 50 atom % to 65 atom % with respect to all metallic atoms.

10. A transport conductive film according to claim 1 or 2, wherein the mean transmittance in the visible region is greater than 80%.

* * * * *